United States Patent
Watkins et al.

(10) Patent No.: US 8,786,097 B2
(45) Date of Patent: Jul. 22, 2014

(54) METHOD OF FORMING VIAS IN SEMICONDUCTOR SUBSTRATES AND RESULTING STRUCTURES

(75) Inventors: Charles M. Watkins, Eagle, ID (US); Kyle K. Kirby, Boise, ID (US); Alan G. Wood, Boise, ID (US); Salman Akram, Boise, ID (US); Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 18 days.

(21) Appl. No.: 12/955,359

(22) Filed: Nov. 29, 2010

(65) Prior Publication Data

US 2011/0074043 A1    Mar. 31, 2011

Related U.S. Application Data

(60) Division of application No. 11/781,083, filed on Jul. 20, 2007, now Pat. No. 7,855,140, which is a continuation of application No. 11/140,402, filed on May 27, 2005, now Pat. No. 7,598,167.

(60) Provisional application No. 60/604,234, filed on Aug. 24, 2004.

(51) Int. Cl.
*H01L 23/48* (2006.01)
*H01L 21/768* (2006.01)

(52) U.S. Cl.
CPC ................ *H01L 21/76898* (2013.01)
USPC ............... 257/774; 257/773; 257/E23.011

(58) Field of Classification Search
CPC ................................ H01L 21/76898
USPC ................................ 257/773, 774
See application file for complete search history.

(56) References Cited

U.S. PATENT DOCUMENTS

| 4,445,978 A | 5/1984 | Whartenby et al. |
| 4,806,111 A | 2/1989 | Nishi et al. |
| 5,229,647 A | 7/1993 | Gnadinger |
| 5,438,212 A | 8/1995 | Okaniwa |
| 6,013,948 A | 1/2000 | Akram et al. |
| 6,018,196 A | 1/2000 | Noddin |
| 6,114,240 A | 9/2000 | Akram et al. |
| 6,294,425 B1 | 9/2001 | Hideki |

(Continued)

OTHER PUBLICATIONS

Lee et al., Laser Created Silicon Vias for Stacking Dies in MCMs, EMT Symposium, 1991, Tampa, Florida, pp. 262-265.

(Continued)

*Primary Examiner* — Alexander Ghyka
(74) *Attorney, Agent, or Firm* — TraskBritt (57) ABSTRACT

Methods for forming through vias in a semiconductor substrate and resulting structures are disclosed. In one embodiment, a through via may be formed by forming a partial via from an active surface through a conductive element thereon and a portion of the substrate underlying the conductive element. The through via may then be completed by laser ablation or drilling from a back surface. In another embodiment, a partial via may be formed by laser ablation or drilling from the back surface of a substrate to a predetermined distance therein. The through via may be completed from the active surface by forming a partial via extending through the conductive element and the underlying substrate to intersect the laser-drilled partial via. In another embodiment, a partial via may first be formed by laser ablation or drilling from the back surface of the substrate followed by dry etching to complete the through via.

18 Claims, 4 Drawing Sheets

(56) References Cited

U.S. PATENT DOCUMENTS

| | | |
|---|---|---|
| 6,420,209 B1 | 7/2002 | Siniaguine |
| 6,620,731 B1 | 9/2003 | Farnworth et al. |
| 6,667,551 B2 | 12/2003 | Hanaoka et al. |
| 7,598,167 B2 | 10/2009 | Watkins et al. |
| 2007/0262464 A1 | 11/2007 | Watkins et al. |

OTHER PUBLICATIONS

Chu et al., Laser Micromachining of Through Via Interconnects in Active Die for 3-D Multichip Module, IEEE/CMPT Int'l EMT Symposium, 1995, pp. 120-126.

METHOD OF FORMING VIAS IN SEMICONDUCTOR SUBSTRATES AND RESULTING STRUCTURES

CROSS-REFERENCE TO RELATED APPLICATIONS

This application is a divisional of U.S. patent application Ser. No. 11/781,083, filed Jul. 20, 2007, now U.S. Pat. No. 7,855,140, issued Dec. 21, 2010, which is a continuation of U.S. patent application Ser. No. 11/140,402, filed May 27, 2005, now U.S. Pat. No. 7,598,167 issued Oct. 6, 2009, which claims the benefit of U.S. Provisional Patent Application, Ser. No. 60/604,234, filed Aug. 24, 2004, the disclosure of each of which is hereby incorporated herein in its entirety by this reference.

BACKGROUND OF THE INVENTION

1. Field of the Invention

The present invention relates to foaming vias in semiconductor substrates and the resulting via structures. More particularly, the present invention relates to methods for forming vias in semiconductor substrates such that active surface devices are not damaged during formation of vias through a semiconductor substrate.

2. State of the Art

Semiconductor devices including integrated circuitry, such as memory dice, are mass produced by fabricating hundreds or even thousands of identical circuit patterns on a single semiconductor wafer or other bulk semiconductor substrate using photolithography in combination with various other processes. It is a continual goal of semiconductor manufacturers to increase the density of semiconductor devices fabricated on a given size of semiconductor substrate to achieve increased yield of semiconductor devices and enhanced performance thereof. In recent years, efforts to increase the density of semiconductor devices in a semiconductor assembly have also intensified.

One method for increasing the density of semiconductor devices in a semiconductor assembly is to stack semiconductor dice to create a three-dimensional multichip module (3-D MCM). The formation of a 3-D MCM typically requires creating vias (i.e., through holes) in at least one semiconductor die that extend from its active surface to the opposing back surface thereof. The vias are filled with an electrically conductive material that electrically connects the via to the integrated circuitry fabricated on the active surface. Thus, the vias provide an electrical pathway from the active surface of a semiconductor die to its respective back surface, enabling interconnection of the back surface of the semiconductor die to external electrical contacts of another semiconductor die or a carrier substrate of the 3-D MCM.

Various methods for forming vias in semiconductor substrates have been disclosed. Etching and laser ablation or drilling are two frequently used methods. Etching employing photolithographic processing of a resist followed by wet (chemical) or dry (reactive ion) etching to define the vias may suffer from problems with precisely aligning the vias with the electrical components on the opposing surface of the semiconductor substrate and, particularly with wet etch chemistry, undercutting of substrate material below the photomask. Laser drilling has been used to form vias by ablating semiconductor material to form through holes extending through the entire thickness of a semiconductor die. Representative patents disclosing laser drilling vias are U.S. Pat. No. 6,667,551 to Hanaoka et al., U.S. Pat. No. 6,114,240 to Akram et al., and U.S. Pat. No. 4,445,978 to Whartenby et al. While forming vias using laser drilling has the advantage of being significantly faster and in some instances, more locationally accurate and dimensionally precise than forming vias by wet or dry etching, the laser drilling process may cause damage to the integrated circuitry of the semiconductor dice fabricated on the active surface of semiconductor substrate. This is, in part, due to the thermal input of the laser creating a three-dimensional (3-D) heat flow surrounding the heat affected zone (HAZ) in the substrate near the via being created. This 3-D heat flow can raise the temperature of the integrated circuitry forming the semiconductor devices proximate the via being drilled, causing degradation or malfunctioning of the semiconductor devices contained within the active region of the semiconductor die.

Accordingly, there is a need for a method of forming vias in semiconductor substrates by employing the ability to rapidly form precisely located and dimensioned vias offered by laser drilling without damaging the active surface devices during the laser drilling process.

BRIEF SUMMARY OF THE INVENTION

The present invention, in a number of embodiments, includes methods for forming through vias in semiconductor substrates without damaging the semiconductor devices contained within the active regions thereof and the resulting via structures.

In a broad exemplary embodiment, a method of forming through vias in a semiconductor substrate is disclosed. A semiconductor substrate having an active surface, including a plurality of discrete conductive elements thereon, a back surface, and at least one active region is provided. At least one first portion of the semiconductor substrate underlying at least one of the plurality of discrete conductive elements may be removed to form at least one first partial via extending from the active surface partially through the semiconductor substrate to at least a junction depth of the associated at least one active region. At least one second portion of the semiconductor substrate may be removed to form at least one second partial via extending from the back surface partially through the semiconductor substrate to meet the at least one second partial via. The at least one first and the at least one second partial via form at least one through via that extends from the at least one of the plurality of discrete conductive elements to the back surface of the semiconductor substrate.

In an exemplary embodiment, an aperture may be formed in the at least one of the plurality of discrete conductive elements prior to forming the at least one first partial via in order to expose the material of the underlying semiconductor substrate. After forming the aperture and the first partial via, the second partial via may be formed to complete the through via.

In another exemplary embodiment, the at least one second partial via may be formed prior to forming the aperture in the at least one of the plurality of discrete conductive elements and the at least one first partial via. After formation of the at least one second partial via that extends from the back surface, the aperture in the at least one of the plurality of discrete conductive elements may be formed, followed by formation of the at least one first partial via to complete the at least one through via.

In yet another exemplary embodiment, the at least one second partial via extending from the back surface a distance within the semiconductor substrate may be formed by removing material from the back surface of the semiconductor substrate. The at least one through via may be formed to expose the backside of the at least one of the plurality of discrete conductive elements in forming the at least one first partial via by removing the remaining semiconductor substrate material between the terminus of the at least one second partial via and the backside of the discrete conductive elements.

These features, advantages, and alternative aspects of the present invention will be apparent to those skilled in the art from a consideration of the following detailed description taken in combination with the accompanying drawings.

BRIEF DESCRIPTION OF THE SEVERAL VIEWS OF THE DRAWINGS

In the drawings, which illustrate what is currently considered to be the best mode for carrying out the invention and in which like elements and features are identified by like reference numerals.

DETAILED DESCRIPTION OF THE INVENTION

The present invention, in a number of embodiments, includes methods for forming through vias that extend through the thickness of a semiconductor substrate between an active surface and a back side thereof without damaging the semiconductor devices formed thereon, and the resulting via structures. The present invention may be used to form so-called "through wafer interconnects" (TWIs) for electrically connecting the integrated circuitry of semiconductor dice (also encompassed by the term "semiconductor devices" herein) fabricated on the active surface of the semiconductor substrate to another semiconductor device or to higher level packaging. The methods of the present invention, as described in more detail below, may be performed after the semiconductor devices of the semiconductor substrates have been fabricated and tested (e.g., wafer probe burn-in testing).

Figure 1A:
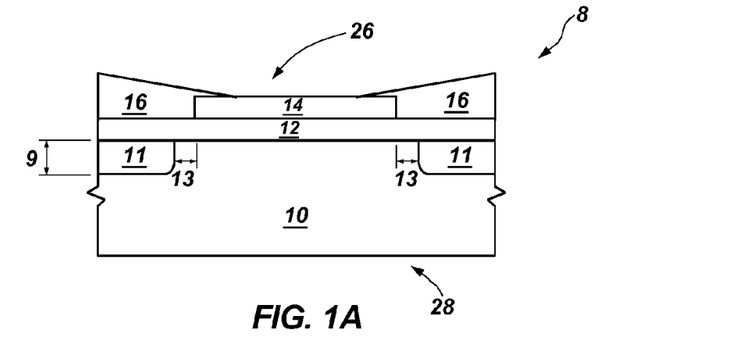
FIG. 1A is a sectional view illustrating a semiconductor substrate having an active region and a plurality of discrete conductive elements thereon.

Referring to FIGS. 1A-1J, exemplary methods of the present invention for forming through vias are disclosed. FIG. 1A illustrates a simplified portion of an exemplary semiconductor wafer 8 formed from semiconductor substrate 10 having an active surface 26 and a back surface or back side 28. As shown in FIG. 1A, a semiconductor substrate 10 is provided that may have one or more dielectric layers 12 disposed thereon. Semiconductor substrate 10 may comprise, without limitation, a bulk semiconductor substrate (e.g., a full or partial wafer of semiconductor material, such as silicon, gallium arsenide, indium phosphide, polysilicon, a silicon-on-insulator (SOI) type substrate, such as silicon-on-ceramic (SOC), silicon-on-glass (SOG), or silicon-on-sapphire (SOS), etc.) that includes a plurality of semiconductor devices thereon, and semiconductor dice. If a wafer, semiconductor substrate 10 may also be a full thickness wafer as received from a vendor or a wafer thinned from the back side after fabrication of semiconductor dice thereon. Dielectric layer 12 may be formed from materials such as, by way of example only, silicon dioxide, silicon nitride, or borophosphosilicate glass (BPSG). Passivation layer 16 covers portions of the active surface 26 with discrete conductive elements 14 in the form of bond pads exposed therethrough. Active regions 11 including gate areas or a junction depth 9 and laterally spaced a distance 13 from the periphery of discrete conductive element 14 are illustrated in FIG. 1A. The junction depth 9 may be, typically, on the order of about 4-5:m into the silicon of the semiconductor die, as distinguished from the entire active area or region 11 of the die which includes structures on the surface (not shown) such as transistors, capacitors and other structures, formed as well known in the art. Discrete conductive elements 14, such as, for example, the aluminum bond pads depicted are shown bonded to the dielectric layer 12 and are electrically connected to the active region 11 using, for example, redistribution lines (RDL) on the active surface 26 that are not shown. The discrete conductive elements 14 are located in portions of "dead space" in the active surface 26 of the semiconductor substrate 10 without integrated circuitry formed thereunder.

Figure 1B:
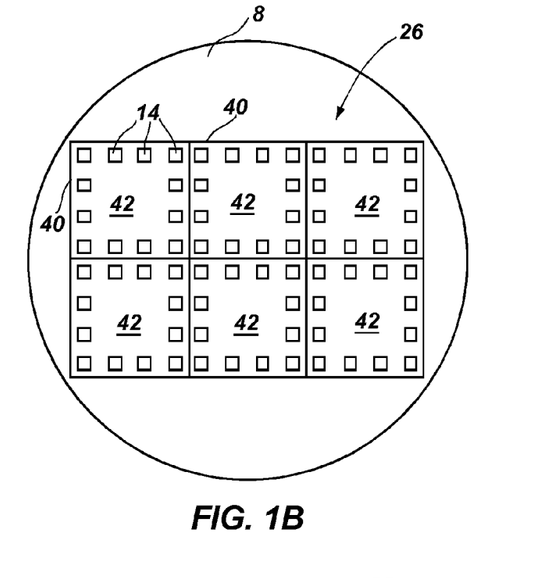
FIG. 1B is a plan view of the active surface of a semiconductor substrate illustrating a plurality of semiconductor dice having discrete conductive elements thereon.

The through vias of the present invention may be formed at either the semiconductor die level or at the wafer (or other bulk substrate) level, depending upon the needs of the particular manufacturing process used. While FIG. 1A only shows a single discrete conductive element 14, it should be understood that semiconductor wafer 8 contains a plurality of discrete conductive elements 14 formed in the "dead space" of a semiconductor substrate 10 between active regions 11 as illustrated in the view of active surface 26 of semiconductor wafer 8 from above as shown in FIG. 1B. The reference lines 40 define the boundaries or "streets" between individual semiconductor dice 42 formed on the semiconductor wafer 8.

Figure 1C:
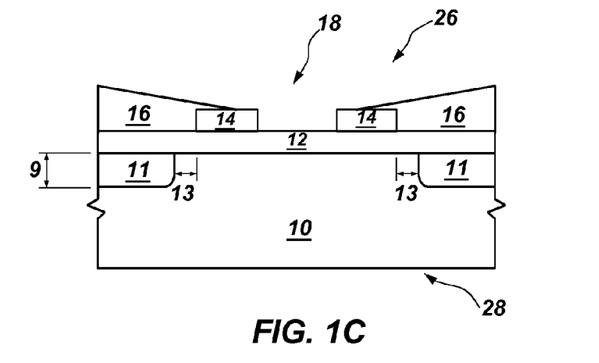
FIGS. 1C-1G are sectional views illustrating exemplary methods for forming a partial via in a semiconductor substrate that extends from the active surface therein.
Figure 1D:
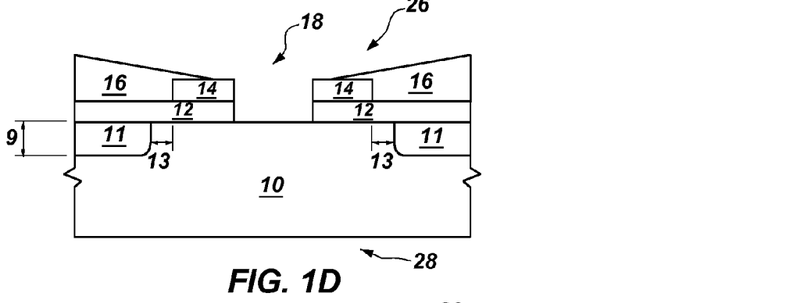

Referring to FIG. 1C, an aperture 18 may be formed approximately in the center of the discrete conductive elements 14 by appropriately masking and patterning a photoresist or other material (e.g., oxide hard mask) and wet or dry etching. One suitable wet metal etch employs a mixture of nitric acid and hydrofluoric (HF) acid in deionized (DI) water. "Dry" etching may also be termed reactive ion etching (RIE). As shown in FIG. 1D, either a wet or dry etchant may be used to form aperture 18 as well as to etch completely through dielectric layer 12 and to remove the native oxide on semiconductor substrate 10. For example, if the semiconductor substrate 10 is made from silicon, a silicon dioxide native oxide requires removal, and the HF etchant may be used for this purpose prior to etching of the underlying silicon of the semiconductor substrate.

In another exemplary method, laser drilling using a plurality, for example two or three, short bursts or pulses from a laser may be used to remove material from the discrete conductive elements 14 and dielectric layer 12 to form the aperture 18 as shown in FIG. 1D. The accurate targeting of the discrete conductive elements 14 with a laser beam may be effected by using fiducial marks on the semiconductor substrate 10, a machine vision system, or a combination of both. It is currently preferred to use two or three 100-microsecond short bursts from a solid state YAG laser operating at 20 kHz. The laser drilling may be effected using equipment, such as the Model 5000-series lasers, offered currently by Electro-Scientific Industries of Portland, Oreg. One specific, suitable piece of equipment is a 355 nm wavelength UV YAG laser, Model 2700, which may be used to form the aperture 18.

Another suitable laser system is the Xise 200, offered by Xsil Ltd. of Dublin, Ireland, which also has a U.S. office in Loveland, Colo. The Xsil product may be used to form vias as little as about 10:m to about 15:m in diameter. The areas of semiconductor substrate 10 irradiated by the laser may reach a temperature of 1400° C. It is currently believed that above 600° C. damage occurs to the active regions 11. By using a plurality of short bursts from the laser, heat flow into the semiconductor substrate 10 due to the thermal input from laser is minimized during forming of aperture 18 and deleterious effects, such as dopant redistribution within the active region 11, do not occur. If laser drilling is used to form the aperture 18, a wet etchant, such as a dilute HF etch may be used to remove the native oxide present on the semiconductor substrate 10. Then wet silicon etch such as 6% TMAH in propylene glycol may be used to remove and smooth the heat-damaged silicon surrounding aperture 18, such heat-damaged silicon being referred to in the art as the heat-affected zone (HAZ).

Figure 1E:
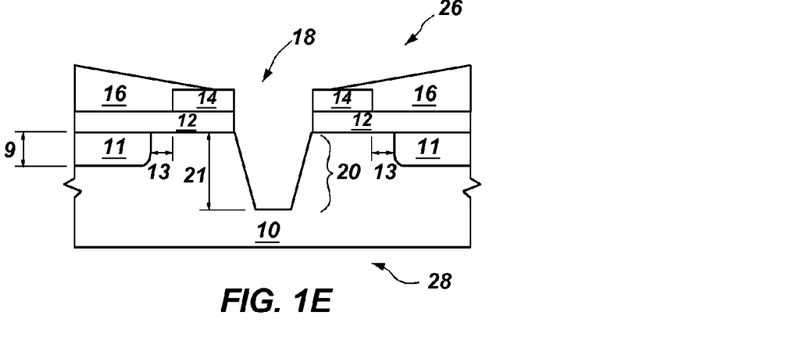
Figure 1F:
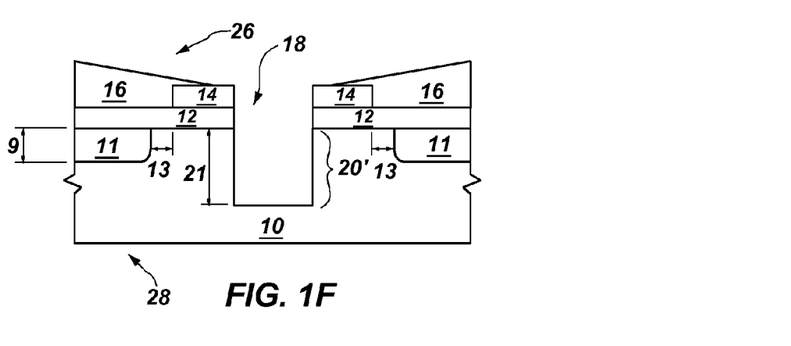
Figure 1G:
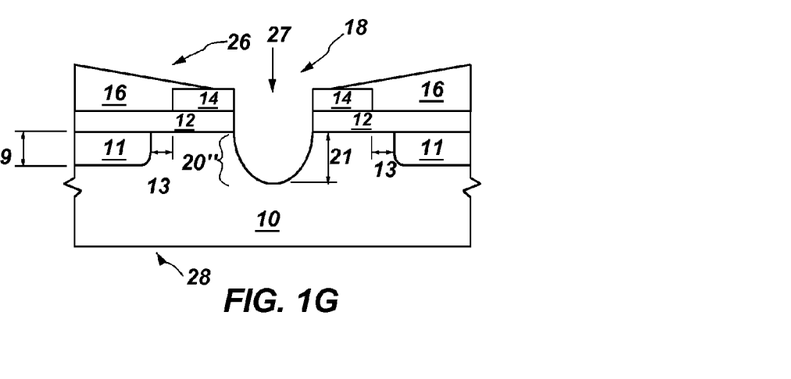

Referring to FIGS. 1E-1G, partial vias may be formed within the semiconductor substrate 10 from the active surface thereof by wet etching, dry etching, or laser drilling. The partial vias 20, 20', and 20" shown in FIGS. 1E-1G, respectively, are formed to extend from the active surface 26 to a depth 21 within the semiconductor substrate 10. As shown in FIG. 1E, in an exemplary embodiment, a selective wet etch may be used to form partial via 20 within the semiconductor substrate 10. One suitable selective wet etchant is 6% tetramethyl ammonium hydroxide (TMAH) in propylene glycol when semiconductor substrate 10 is single crystal silicon. This TMAH solution is a suitable etchant because it will not substantially etch metal or oxide and, thus, will not etch discrete conductive elements 14. Therefore, it is not necessary to mask the discrete conductive element 14. The TMAH preferentially etches specific crystal planes of silicon, the (100) and (111) crystal planes, to produce the tapered cross-sectional shape of partial via 20 if the semiconductor substrate 10 is made from single crystal silicon. Referring to FIG. 1F, in another exemplary embodiment, partial via 20' may be formed if a dry etchant is used instead of the selective TMAH etchant. If dry etchant (e.g., reactive ion etching) is used, the partial via 20' will exhibit a substantially rectangular (vertical side walls) side cross-sectional configuration in contrast to the tapered cross-section of the partial via 20 formed with the isotropic etchant. An anisotropic wet etchant such as, for example, 20% to 25% TMAH at 90° C. or 22% KOH at 75° C. may also be used, but an additional silicon oxide or silicon nitride mask layer may then be required to protect the metal of the discrete conductive elements 14 from being etched. If a dry etchant is used, the additional mask layer is not necessary. However, when employing dry etching, the initial mask should be an oxide layer of suitable thickness. Referring to FIG. 1G, in another exemplary embodiment, the partial via 20" may be formed by short burst laser drilling from the active surface in the direction 27, wherein the partial via 20" exhibits a larger diameter at the active surface 26 and a smaller diameter at the terminus of the partial via 20". It should be understood that if the aperture 18 in discrete conductive element 14 is formed using laser drilling, the partial via 20" may be formed by simply continuing the laser drilling process for a sufficient time to form the partial via 20', taking into account the need to control excessive heating of the semiconductor substrate 10. At the conclusion of the formation of partial via 20" using laser drilling, the above described 6% TMAH in propylene glycol may be used to clean and enlarge the partial via, if desired.

At a minimum, the depth 21 of partial vias 20, 20', and 20" may be selected to be as deep as junction depth 9 of the associated active regions 11, which may be, for example, about 4 μm. The depth 21 of partial vias 20, 20', and 20" may extend sufficiently below the junction depth 9 of active regions 11 so that upon laser drilling from the back surface 28 of semiconductor substrate 10, the 3-D heat flow from the laser drilling process does not raise the temperature to a sufficient degree to damage the active regions 11. Thus, deleterious problems, such as dopant redistribution within the active region 11, are not caused by the laser drilling process employed in the present invention. It is currently believed by the inventors that below 600° C., dopant redistribution does not occur in the active regions 11. An exemplary depth 21 for partial vias 20, 20', and 20" may be about 5:m to about 20:m from the active surface 26. A more preferred depth 21 for partial vias 20, 20', and 20" is about 5:m to about 10:m from the active surface 26. However, the precise magnitude for depth 21 is dependent on the junction depth 9 of the active regions 11 and the lateral spacing distance 13 of the active regions 11 from the discrete conductive elements 14. The greater the lateral spacing distance 13 of the active regions 11 from the discrete conductive elements 14, the lesser the required depth 21 of the partial vias 20, 20', and 20" to avoid damage to active regions 11. This is because upon laser drilling the rest of the via from the back surface 28, as will be discussed in more detail below with respect to FIGS. 1H-1J, the heat flow near a partial via 20, 20' or 20" created during the laser drilling process may not project laterally sufficiently far from the via being formed to raise the temperature within an adjacent active region 11 to a degree to cause substantial dopant redistribution within the active region 11. Thus, the integrated circuitry within the active region 11 will not degrade or malfunction upon completing a through via by laser drilling from the back surface 28.

Figure 1H:
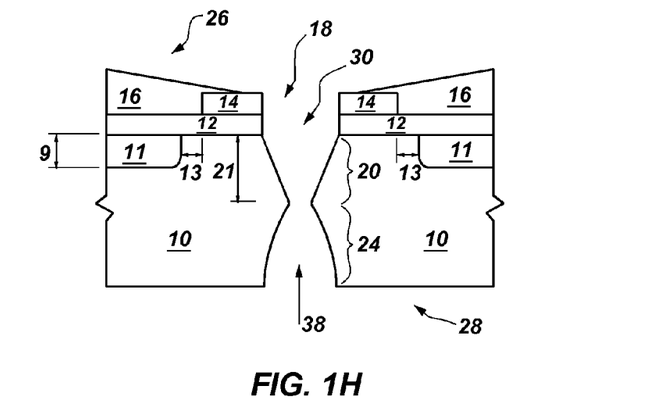
FIGS. 1H-1J are sectional views illustrating exemplary methods for forming a partial via in a semiconductor substrate that extends from the back surface to form a through via in combination with a partial via extending from the active surface as shown in FIGS. 1C-1G.
Figure 1I:
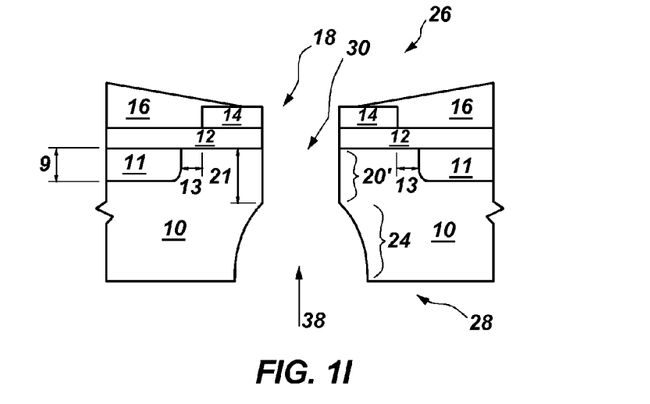
Figure 1J:
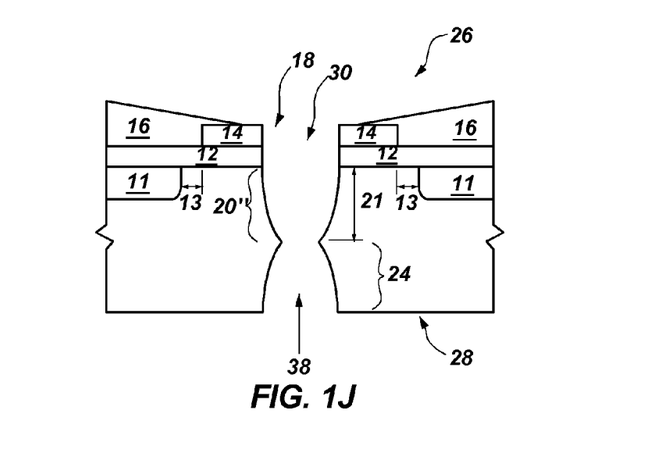

Referring to FIGS. 1H-1J, the through vias 30 of the present invention may be completed by laser drilling from the back surface 28 in the direction 38 to form partial via 24. A 355 nm wavelength laser, as previously referenced, may be operated at a power of about 4 W to 9 W, for example 5W, and from about a 20 kHz to a 60 kHz cycle or repetition rate to form partial via 24. In an exemplary embodiment, one partial via 24 is partially formed by laser drilling a small amount of material from the back surface 28 of the semiconductor substrate 10 followed by moving to another location and removing a small amount of material from the back surface 28 to partially form another partial via 24. This process is repeated by alternating applications of pulses of laser energy between intended locations of partial vias 24 until a through via 30 is formed in each respective location. This alternating process prevents the detrimental buildup of heat in the areas surrounding the partial vias 24 being formed sufficient to damage the active regions 11. Furthermore, the inventors have found that alternating the application of laser energy between selected locations on the semiconductor substrate 10 enables forming the partial vias 24 at a faster rate than may be accomplished by completely forming a partial via 24 one at a time by the use of multiple sequential pulses applied at a single location. For example, employing the described alternating location process enables forming about 22,000 partial vias 24 in about ten minutes. The depth of substrate material drilled by the laser may be controlled based on an experimental correlation between the number of pulses and the amount of material ablated from semiconductor substrate 10. Of course, it is also possible to laser drill one partial via 24 at a time using short bursts or pulses of laser energy to remove substrate material using a so-called "percussion drill" technique, but such an approach is more likely to result in an unacceptable heat buildup in the material of the semiconductor substrate unless laser pulse duration and time between pulses are carefully controlled, which increases process time.

With continued reference to FIGS. 1H-1J, the laser drilling process removes the remaining material from semiconductor substrate 10 between the back surface 28 and the bottom of a partial via 20, 20' or 20" necessary to form a through via 30 that extends from the back surface 28 to the active surface 26. Optionally, an isotropic wet etchant, such as a 6% TMAH in propylene glycol, may be used to remove any debris caused by the laser drilling process, to remove the heat-damaged material commonly termed the heat affected zone, or HAZ, present at the interior walls of the partial via 24 due to the laser drilling process, to smooth the interior region of the through via 30, and to enlarge the diameter of the through via 30. The resultant side cross-sectional shapes for the through vias 30 formed using the various processes are illustrated in FIGS. 1H-1J. FIG. 1H illustrates through via 30 when the partial via 20 is formed using an anisotropic etchant. FIG. 1I illustrates the cross-sectional shape of through via 30 when an isotropic etchant or a dry etchant is used to form the partial via 20'. FIG. 1J illustrates the cross-sectional shape of through via 30 when the partial via 20" is formed using laser drilling. In all of the partial vias 24 formed by laser drilling, the diameter, typically, is larger at the back surface 28, tapering down to a smaller diameter where the partial via 24 terminates at the bottom of a partial via 20, 20' or 20".

Although the methods for forming the through vias 30, detailed with respect to FIGS. 1A-1J, were described as using a process that first forms an aperture 18 and partial vias 20, 20' or 20" by removing material from the active surface 26 in a direction toward back surface 28 followed by forming a partial via 24 by laser drilling from the back surface 28 in a direction 38, other methods may be used in accordance with the present invention. The through vias 30 may also, in accordance with the present invention, be formed by first laser drilling from the back surface 28 in a direction 38 to form partial via 24 followed by forming the aperture 18 and subsequently a partial via 20, 20' or 20" as previously described to effect removal of material from the active surface 26 in a direction toward the back surface 28 until partial via 24 is intersected.

Figure 2A:
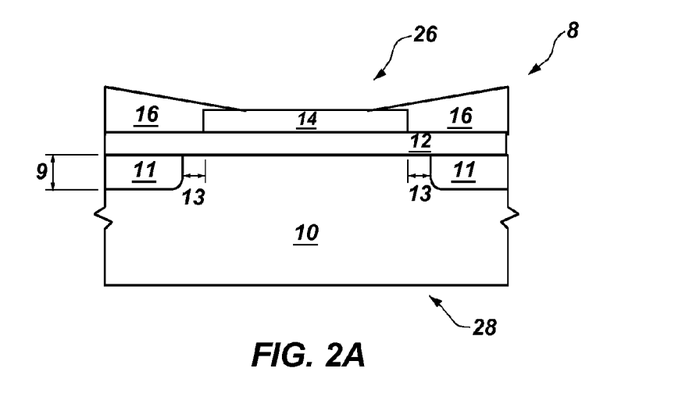
FIGS. 2A-2C are sectional views illustrating yet another exemplary method for forming through vias in a semiconductor substrate.
Figure 2B:
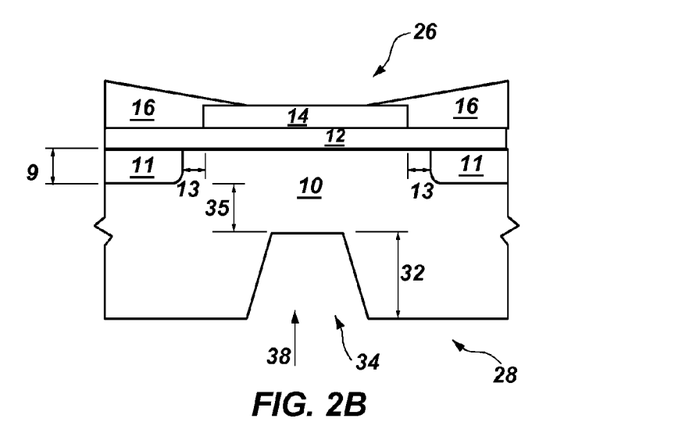
Figure 2C:
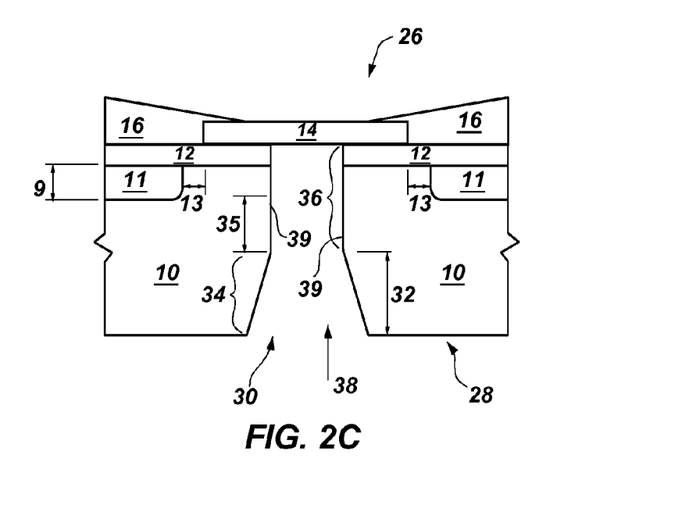

Another exemplary method for forming through vias 30 is described with respect to FIGS. 2A-2C. The exemplary method illustrated in FIGS. 2A-2C enables rapidly forming a majority of a through via using laser drilling. The remainder of the through via proximate the active regions 11 may be formed by a process that does not create a heat flow that damages the integrated circuitry within the active region 11. Referring to FIG. 2A, a semiconductor wafer 8 is provided that is identical to that described in FIG. 1A. As illustrated in FIG. 2B, a partial via 34 having a depth 32 from the back surface 28 may be formed by laser drilling from the back surface 28 of the semiconductor substrate 10 in a direction 38 toward active surface 26 to effect the removal of material from semiconductor substrate 10. Over the power range previously referenced herein, a 355 nm wavelength laser operated, for example, power of 5 W may effect a nominal 3 μm depth ablation per pulse through the silicon. In operation, a range of power from the aforementioned 4 W to 9 W and a pulse or repetition rate of about 20 to about 60 kHz may be suitable, the number of pulses required to reach a desired depth being determinable from an initial via cross-section ablated by the laser beam. The partial via 34 may be formed to terminate approximately 25:m or more from the active regions 11, as shown by distance 35 in FIG. 2B. However, the depth 32 of the partial via 34 may extend from the back surface 28 and terminate at junction depth 9 of the active regions 11. As with the exemplary embodiments illustrated in FIGS. 1A-1J, the precise magnitude for depth 32 of partial via 34 is dependent on the junction depth 9 of the active regions 11 and the lateral spacing distance 13 of the active regions 11 from the paths and side wall locations of the through vias to be formed. The greater the lateral spacing distance 13 of the active regions 11 from peripheries of the discrete conductive elements 14 (and, thus, from the vias to be formed thereunder), the greater the permissible depth 32 of the partial vias 34 and extent thereof from the back surface 28 in proximity to an active region 11.

As with the previous exemplary embodiments described in FIGS. 1A-1J, one partial via 34 may be partially formed by laser drilling a small amount of material from the back surface 28 of the semiconductor substrate 10 followed by moving to another location and removing a small amount of material from the back surface 28 to partially form another partial via 34. This process is repeated by alternating laser drilling between partially formed partial vias 34 until each respective partial via 34 has been formed to its desired depth 32.

Referring to FIG. 2C, the remaining semiconductor substrate 10 and dielectric layer 12 between the end of the partial via 34 most proximate active surface 26 and the discrete conductive element 14 may be removed to form the complete through via 30 by employing a dry etching technique, such as the aforementioned reactive ion etching (RIE). One suitable reactive ion etching process that may be employed to form the partial via 34 is a deep reactive ion etch known as the "Bosch Process," wherein the semiconductor substrate is alternately exposed to an etchant plasma and a passivant plasma. The via side wall profile formed is substantially vertical, the side walls exhibit a "scalloped" texture due to the alternating etching and passivating sequence, and the etch rate, profile and selectivity to a mask material used to cover the back surface 28 of the semiconductor substrate 10 may be controlled by adjusting etch and passivation step efficiency or the time ratio of exposure of the semiconductor substrate 10 to the two types of steps. In an exemplary embodiment, the plasma etchant employed is $SF_6$ and the passivant is $C_4F_8$. Suitable equipment for effecting the deep silicon etch process is available from Oxford Instruments Plasma Technology of Fremont, Calif. The dry etching process effects removal of the remaining semiconductor substrate 10 and dielectric layer 12 between the bottom or end of the partial via 34 and the discrete conductive element 14 in the direction 38 to form the partial via 36. Partial via 36 exhibits a substantially rectangular cross-section having substantially vertical side walls 39. The dry etching process exposes a back side of the discrete conductive elements 14 and forms partial via 36 having a smaller diameter than partial via 34. Unlike the exemplary methods described in FIGS. 1A-1J, it is not necessary to form a hole in the discrete conductive element 14 (i.e., the bond pad). The dry etching is used to form the partial via 36 because of the proximity of partial via 36 to the active region 11. The dry etching process does not create any heat flow projecting from the partial via 36 during its formation capable of causing dopant redistribution within the active region 11. However, if dry etching alone was used to form the through vias 30, the required time to form the through vias 30 would be too long and the process too expensive. Furthermore, if only laser drilling was used, the through via 30 would extend through the discrete conductive element 14 due to difficulty in controlling the depth of the via formed with the laser. The above method employs laser drilling to rapidly form the majority of the through via 30, while the much slower dry etching process is reserved for forming the portion of through via 30 proximate the sensitive active regions 11. Following the completion of the through via 30, an isotropic etchant, such as 6% TMAH in propylene glycol, may be used to remove any debris caused by the laser drilling process, to remove material of the heat affected zone (HAZ) present proximate the interior walls of the partial via 34 due to the laser drilling process, to smooth the interior region of the through via 30, and to enlarge the diameter of the through via 30.

Following the formation of the through vias 30 by any of the above mentioned methods, a conductive filler material (not shown) may be used to fill the through vias to form TWIs having a conductive pathway with the external conductive element 14. Examples of techniques that enable filling the vias with a conductive filler material, such as a metal or alloy, are physical vapor deposition (PVD), electroplating, or electroless plating. A solder paste may also be placed in through vias 30, and reflowed. Further, a conductive or conductor-filled epoxy may be used. Preceding the conductive filler, the side walls of through vias 30 must be coated with a layer of dielectric material to avoid short-circuiting of the conductive filler to the silicon of the substrate. For example, the dielectric material layer may comprise spin-on-glass, thermal oxide, Parylene polymer, low silane oxide (LSO), a pulse deposition layer comprising aluminum rich oxide, silicon dioxide, silicon nitride, silicon oxynitride, a glass, i.e., borophosphosilicate glass, phosphosilicate glass, borosilicate glass, or any other dielectric material having a low dielectric constant known in the art.

A redistribution layer comprising traces and, optionally associated discrete external conductive elements thereon such as solder bumps may be formed on the back surface 28 and electrically interconnected with the TWIs, as is known in the art, for example by forming the traces over the conductive filler material at the back surface ends of the through vias 30.

Although the foregoing description contains many specifics, these are not to be construed as limiting the scope of the present invention, but merely as providing certain exemplary embodiments. Similarly, other embodiments of the invention may be devised which do not depart from the spirit or scope of the present invention. The scope of the invention is, therefore, indicated and limited only by the appended claims and their legal equivalents, rather than by the foregoing description. All additions, deletions, and modifications to the invention, as disclosed herein, which fall within the meaning and scope of the claims are encompassed by the present invention.

What is claimed is:

1. A semiconductor substrate having at least one through via formed therein, comprising:
    a semiconductor substrate having at least one active region, an active surface including a plurality of discrete conductive elements thereon, and a back surface, wherein at least one discrete conductive element of the plurality of discrete conductive elements is located on a portion of the active surface without integrated circuitry under the at least one discrete conductive element; and
    at least one through via extending from the active surface to the back surface at the portion of the active surface without integrated circuitry, wherein the at least one through via includes:
        a first portion that extends from the active surface of the semiconductor substrate to at least a depth of the at least one active region; and
        a second portion having a tapered cross-section that extends from the back surface of the semiconductor substrate to the first portion.

2. The semiconductor substrate of claim 1, wherein the at least one through via further comprises an aperture formed through the at least one discrete conductive element and a dielectric material formed over the active surface.

3. The semiconductor substrate of claim 1, wherein the first portion of the at least one through via extends from the active surface below the depth of the at least one active region.

4. The semiconductor substrate of claim 1, wherein the first portion of the at least one through via extends beneath the active surface to a depth of between about 5 μm and about 20 μm.

5. The semiconductor substrate of claim 1, wherein the first portion of the at least one through via exhibits a substantially frustoconical cross-section, a diameter of the first portion decreasing in a direction from the active surface toward the back surface.

6. The semiconductor substrate of claim 1, wherein the first portion of the at least one through via exhibits a substantially uniform transverse cross-section.

7. A semiconductor substrate, comprising:
    a semiconductor device comprising an active region, an active surface including a plurality of discrete conductive elements thereon, and an opposing back surface, wherein at least one discrete conductive element of the plurality of discrete conductive elements is located on a portion of the active surface without integrated circuitry under the at least one discrete conductive element; and
    at least one via extending through the semiconductor device comprising:
        a first section extending through the active region at least to a depth of the active region, wherein a diameter of the first section decreases continuously from the active region to a terminus of the first section; and
        a second section having a tapered cross-section extending from the back surface to the first section, wherein the second section tapers continuously from the back surface to the first section.

8. The semiconductor substrate of claim 7, wherein the first section of the at least one via extends through the active region into a portion of the semiconductor device below the depth of the at least one active region.

9. The semiconductor substrate of claim 7, wherein the first section comprises a substantially frustoconical cross-section.

10. The semiconductor substrate of claim 7, wherein a diameter of the second section decreases in a direction from the back surface toward the active region.

11. The semiconductor substrate of claim 7, further comprising: a dielectric material disposed over the active region; and wherein the at least one discrete conductive element of the plurality of discrete conductive elements is disposed over the dielectric material.

12. The semiconductor substrate of claim 11, wherein the first section extends through the dielectric material.

13. The semiconductor substrate of claim 12, wherein the first section extends through the at least one discrete conductive element.

14. The semiconductor substrate of claim 11, further comprising:
    a passivation material disposed over at least a portion of the dielectric material and at least a portion of the at least one discrete conductive element.

15. The semiconductor substrate of claim 7, wherein the at least one via is at least substantially filled with a conductive filler material.

16. The semiconductor substrate of claim 15, wherein side walls of the at least one via are coated with dielectric material.

17. The semiconductor substrate of claim 15, further comprising:
   a redistribution layer comprising traces located on the back surface of the substrate.

18. The semiconductor substrate of claim 17, further comprising:
   discrete external conductive elements located on the redistribution layer.

* * * * *